(12) United States Patent
Kosho et al.

(10) Patent No.: US 12,376,266 B2
(45) Date of Patent: Jul. 29, 2025

(54) ELECTRONIC COMPONENT UNIT

(71) Applicant: YAZAKI CORPORATION, Tokyo (JP)

(72) Inventors: Kouzou Kosho, Makinohara (JP); Hiroyuki Takahashi, Makinohara (JP); Kazuaki Kitajima, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 220 days.

(21) Appl. No.: 18/473,186

(22) Filed: Sep. 22, 2023

(65) Prior Publication Data

US 2024/0015934 A1 Jan. 11, 2024

Related U.S. Application Data

(63) Continuation of application No. PCT/JP2022/044330, filed on Dec. 1, 2022.

(30) Foreign Application Priority Data

Dec. 2, 2021 (JP) ................................. 2021-195907

(51) Int. Cl.
*H05K 7/20* (2006.01)

(52) U.S. Cl.
CPC ....... *H05K 7/2049* (2013.01); *H05K 7/20472* (2013.01)

(58) Field of Classification Search
CPC .......................... H05K 7/2049; H05K 7/20472
See application file for complete search history.

(56) References Cited

U.S. PATENT DOCUMENTS 6,364,670 B1 * 4/2002 Wickett ................. H01R 9/226
   439/949
9,293,276 B2 * 3/2016 Kawamura .......... H01H 50/048
(Continued)

FOREIGN PATENT DOCUMENTS

JP 2002-217343 A 8/2002
JP 2010-103370 A 5/2010
(Continued)

OTHER PUBLICATIONS

International Search Report for PCT/JP2022/044330 dated Feb. 7, 2023.

*Primary Examiner* — Mukundbhai G Patel
(74) *Attorney, Agent, or Firm* — KENEALY VAIDYA LLP

(57) ABSTRACT

Included are an electronic component, an insulating holding member holding the electronic component, a conductive routing member provided with an electrical connection portion, and a pressing structure pressing the routing member against a cooling member for cooling. The routing member includes a first held portion and a second held portion held by the holding member, a heat transferring portion transferring heat to the cooling member in contact, a first spring portion pressing the heat transferring portion against the cooling member with spring force generated between the first held portion and the heat transferring portion, and a second spring portion pressing the heat transferring portion against the cooling member with spring force generated between the second held portion and the heat transferring portion. The pressing structure is configured by the first held portion, the second held portion, the heat transferring portion, the first spring portion, and the second spring portion.

20 Claims, 9 Drawing Sheets

(56) References Cited

U.S. PATENT DOCUMENTS

| | | | |
|---|---|---|---|
| 10,637,224 B2 * | 4/2020 | Hiramitsu | ................ H05K 7/20 |
| 2010/0103622 A1 | 4/2010 | Kato et al. | |
| 2018/0307285 A1 | 10/2018 | Shiraga | |
| 2022/0418085 A1 * | 12/2022 | Fujimura | ............. H01H 50/047 |

FOREIGN PATENT DOCUMENTS

| | | |
|---|---|---|
| JP | 2018-206550 A | 12/2018 |
| JP | 2020-61482 A | 4/2020 |
| WO | 2017/122254 A1 | 7/2017 |

* cited by examiner

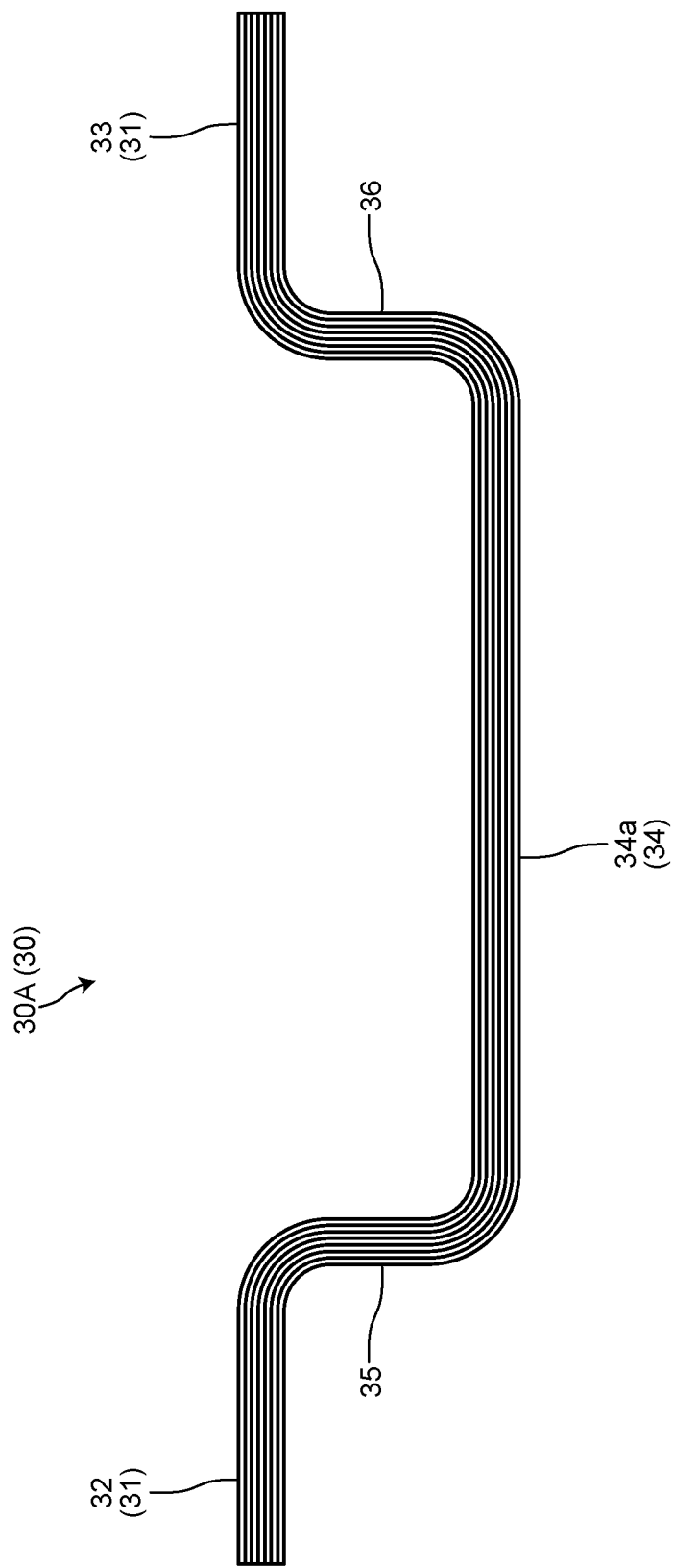

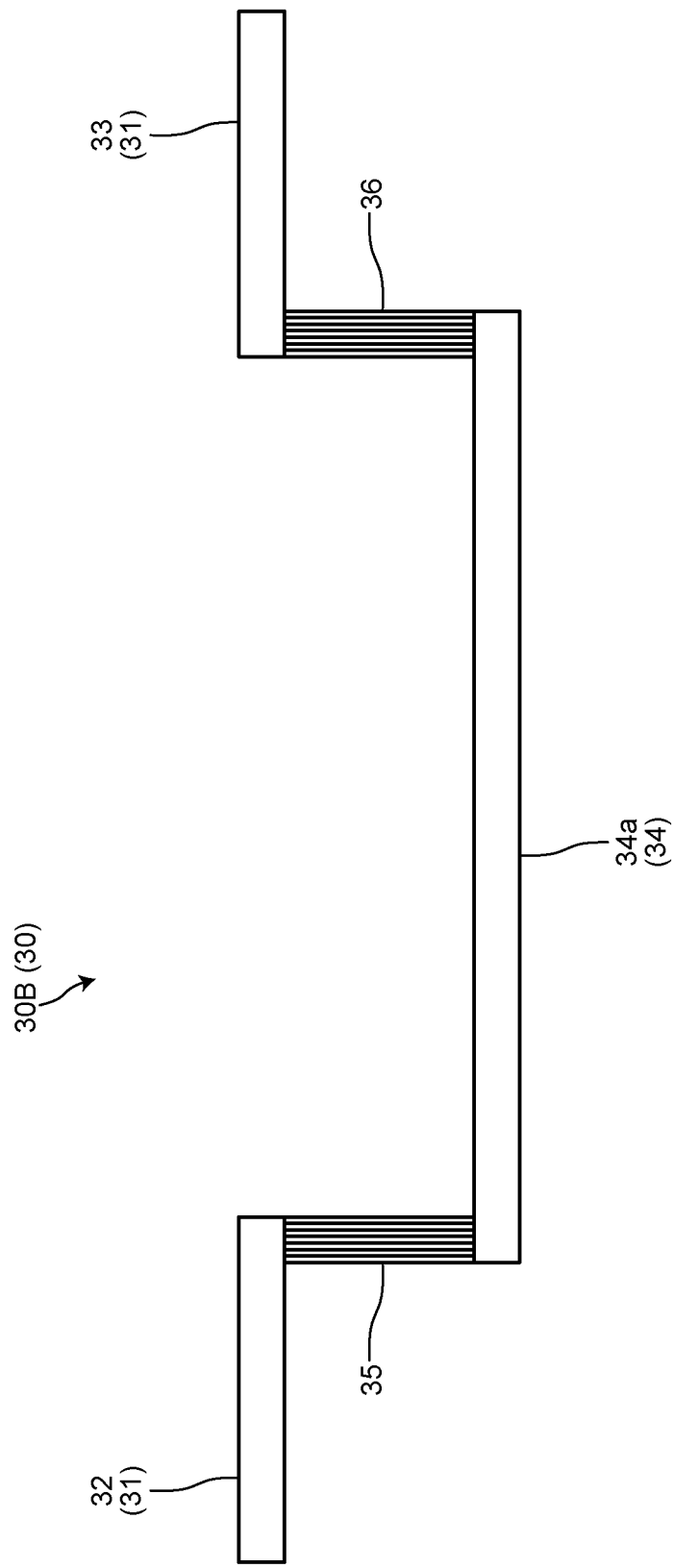

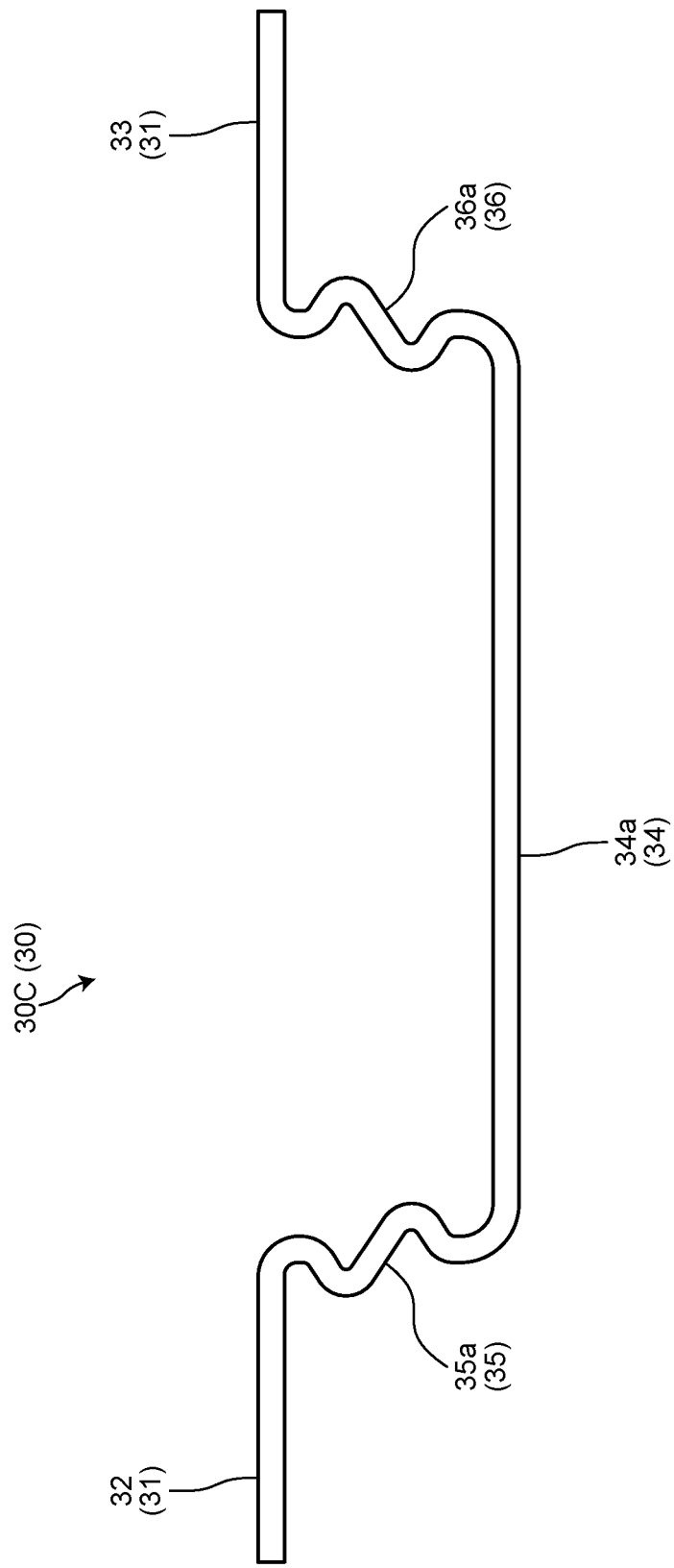

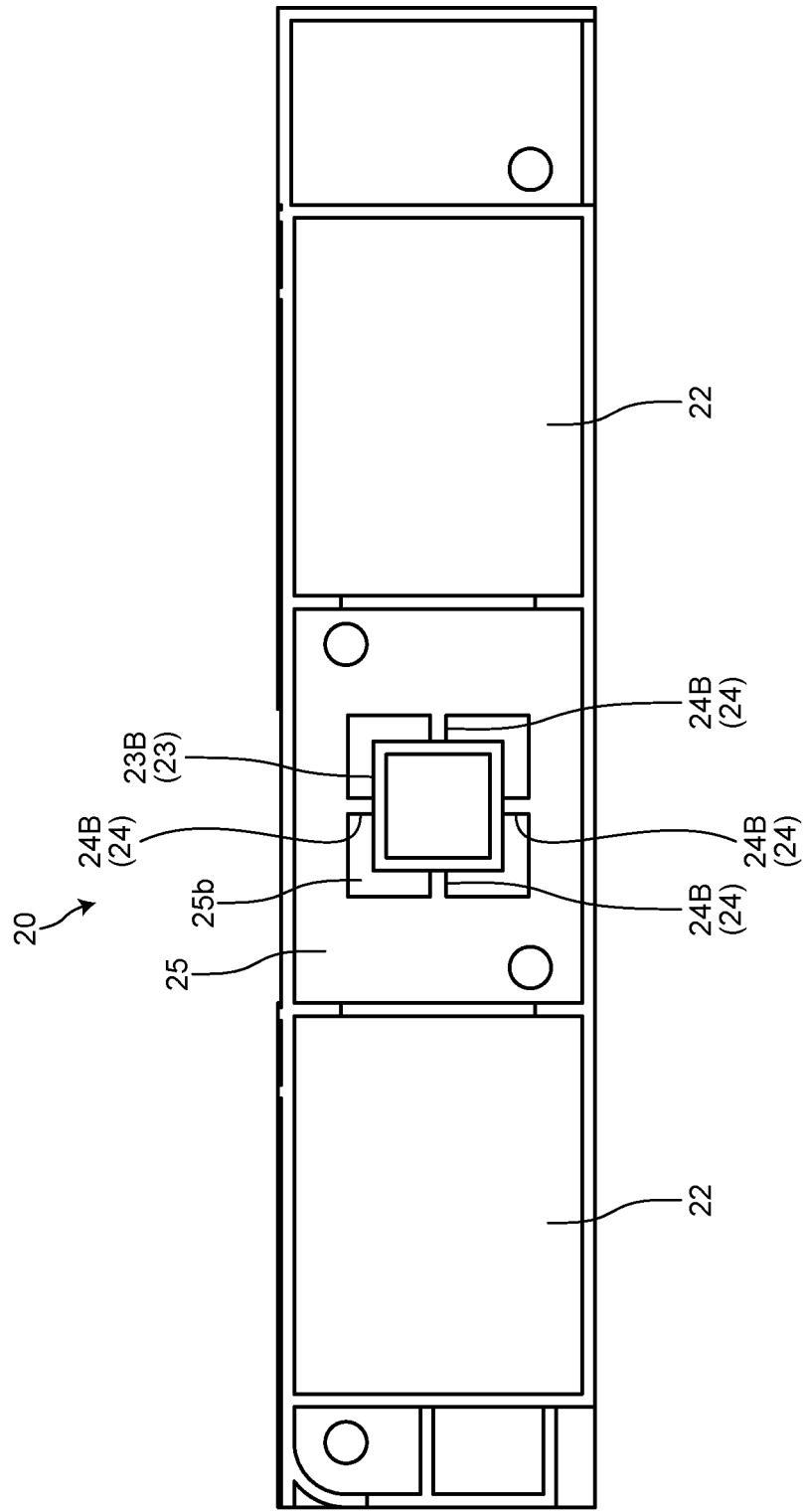

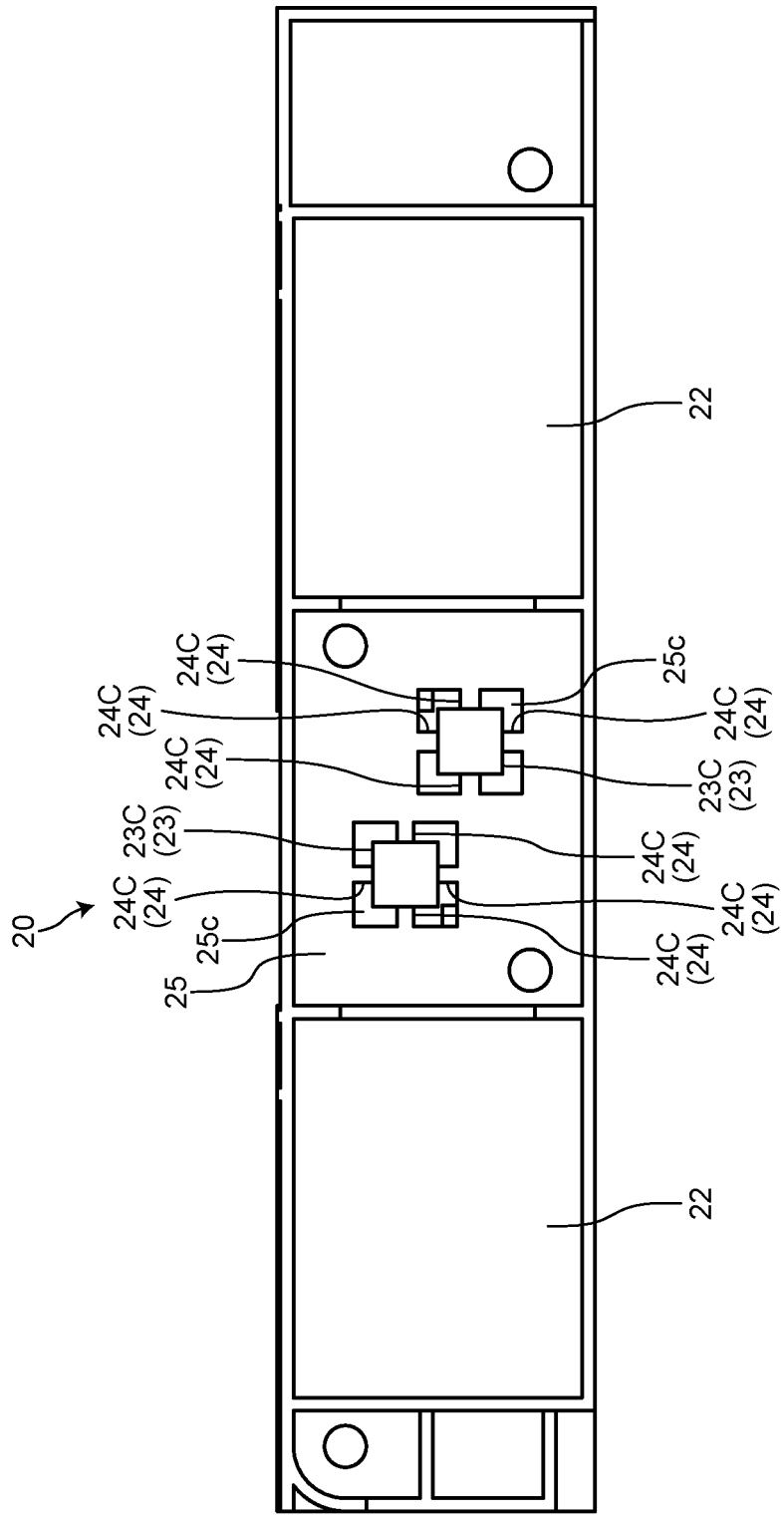

ELECTRONIC COMPONENT UNIT

CROSS-REFERENCE TO RELATED APPLICATION(S)

This application is a continuation application of International Application No. PCT/JP2022/044330 filed on Dec. 1, 2022 which claims the benefit of priority from Japanese Patent Application No. 2021-195907 filed on Dec. 2, 2021 and designating the U.S., the entire contents of which are incorporated herein by reference.

BACKGROUND OF THE INVENTION

1. Field of the Invention

The present invention relates to an electronic component unit.

2. Description of the Related Art

An electronic component unit includes an electronic component and a routing member physically and electrically connected to a conductive member of this electronic component (for example, Japanese Patent Application Laid-open No. 2018-206550 below). For example, this electronic component unit is electrically connected to a battery pack of a vehicle, such as an electric vehicle with a rotary machine as a driving source.

In recent years, in a vehicle, such as an electric vehicle, the battery pack has been increasing in capacity to meet various requirements, such as extension of the driving distance. Unfortunately, in the electronic component unit, an increase in the capacity of the battery pack causes a large current to flow through the electronic component and the routing member, which raises the rate of temperature rise of these. Thus, in the electronic component unit, a measure is required to restrain excessive temperature rise of the electronic component and the routing member.

SUMMARY OF THE INVENTION

Thus, an object of the present invention is to provide an electronic component unit that enables restraint of excessive temperature rise.

In order to achieve the above mentioned object, an electronic component unit according to one aspect of the present invention includes an electronic component; a holding member having an insulating property and holding the electronic component; a routing member having conductivity and provided with an electrical connection portion physically and electrically connected to a conductive member of the electronic component; and a pressing structure pressing the routing member against a cooling member for cooling, wherein the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and the pressing structure being configured by the first held portion, the second held portion, the heat transferring portion, the first spring portion, and the second spring portion, and wherein the pressing structure includes a pressure portion provided as part of the holding member and pressing the heat transferring portion against the cooling member by exerting pressing force on the heat transferring portion sandwiched between the pressure portion and the cooling member, wherein the pressing structure includes an elastically deforming portion provided as part of the holding member and pressing the pressure portion against the heat transferring portion with force reacting to elastic deformation.

In order to achieve the above mentioned object, an electronic component unit according to another aspect of the present invention includes an electronic component; a holding member having an insulating property and holding the electronic component; a routing member having conductivity and provided with an electrical connection portion physically and electrically connected to a conductive member of the electronic component; and a pressing structure pressing the routing member against a cooling member for cooling, wherein the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and the pressing structure being configured by the first held portion, the second held portion, the heat transferring portion, the first spring portion, and the second spring portion, and wherein the routing member is a laminate deformable elastically, a plurality of conductive thin films being laminated in the laminate.

In order to achieve the above mentioned object, an electronic component unit according to still another aspect of the present invention includes an electronic component; a holding member having an insulating property and holding the electronic component; a routing member having conductivity and provided with an electrical connection portion physically and electrically connected to a conductive member) of the electronic component; and a pressing structure pressing the routing member against a cooling member for cooling, wherein the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and the pressing structure being configured by the first held portion, the second held portion, the heat transferring portion, the first spring portion, and the second spring portion, and wherein at least the first spring portion and the second spring portion in the routing member are formed as laminates deformable elastically, a plurality of conductive thin films being laminated in each of the laminates.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a side view illustrating an example routing member.

FIG. 6 is a side view illustrating an example routing member.

FIG. 7 is a side view illustrating an example routing member.

FIG. 8 is a bottom view illustrating an example holding member.

FIG. 9 is a bottom view illustrating an example holding member.

DETAILED DESCRIPTION OF THE PREFERRED EMBODIMENTS

Embodiments of an electronic component unit according to the present invention will be described in detail below with reference to the drawings. Note that the embodiments should not be construed to limit this invention.

Embodiment

One of the embodiments of the electronic component unit according to the present invention will be described with reference to FIGS. 1 to 9.

Figure 1:
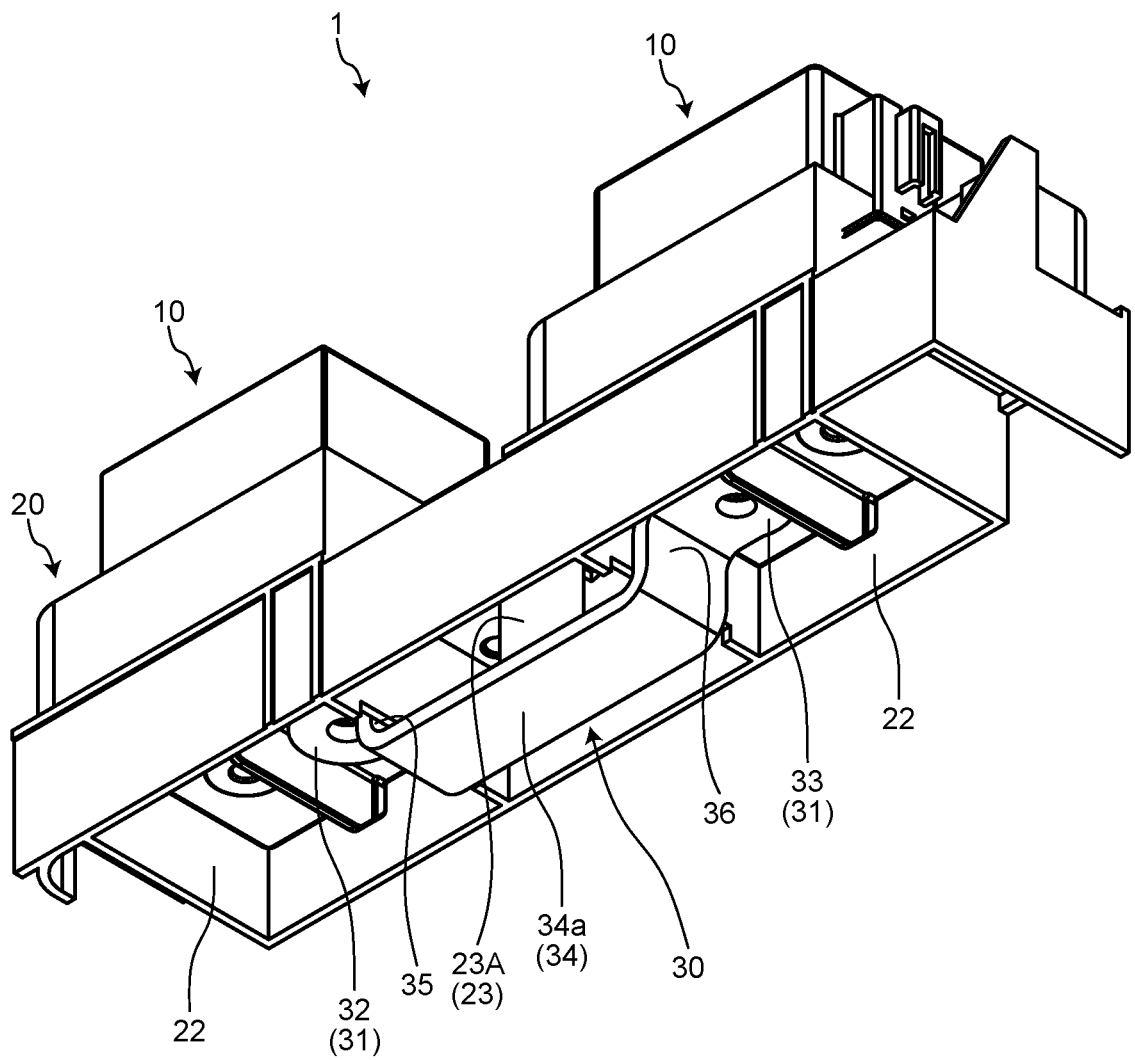
FIG. 1 is a perspective view illustrating an electronic component unit of an embodiment.
Figure 2:
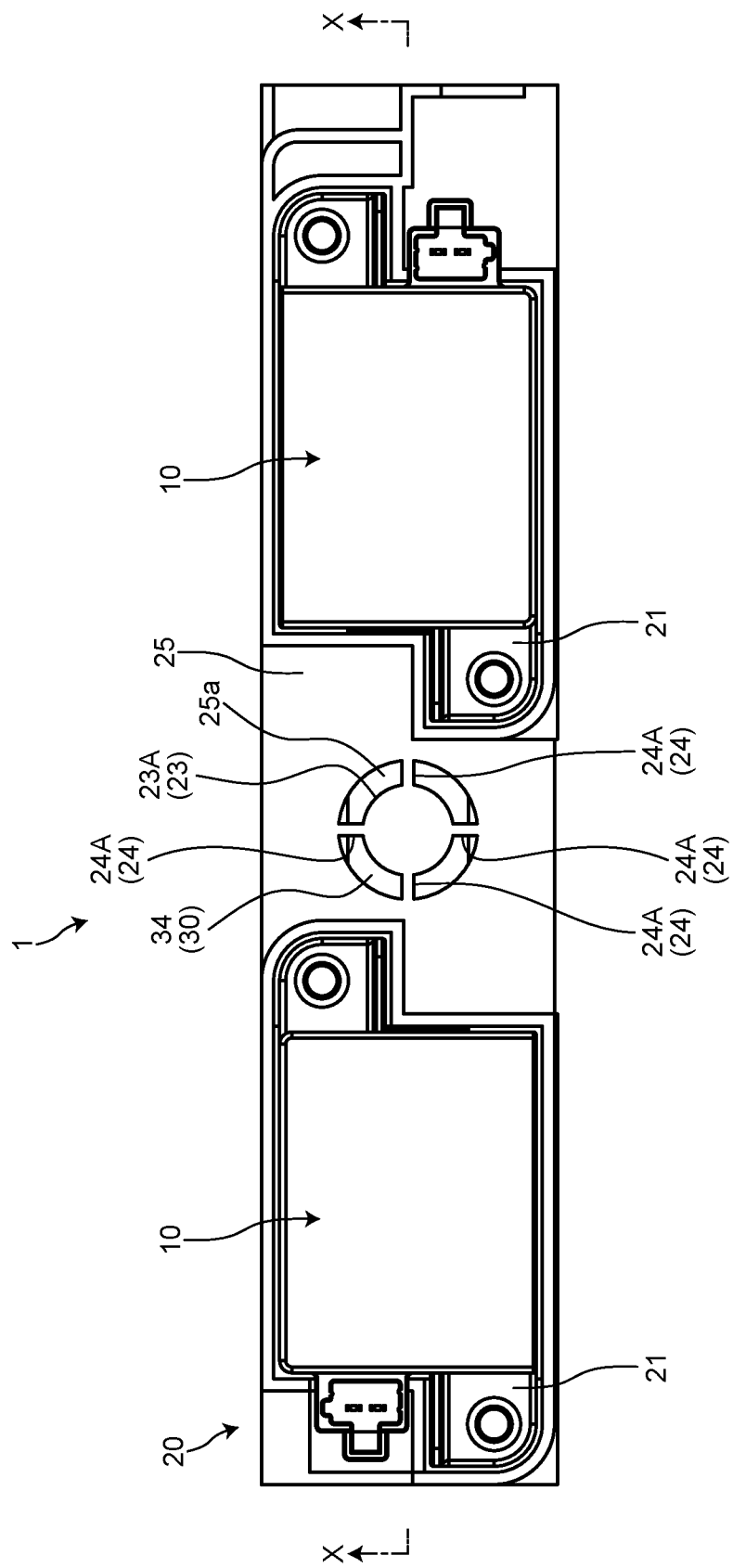
FIG. 2 is a top view illustrating the electronic component unit of the embodiment.
Figure 3:
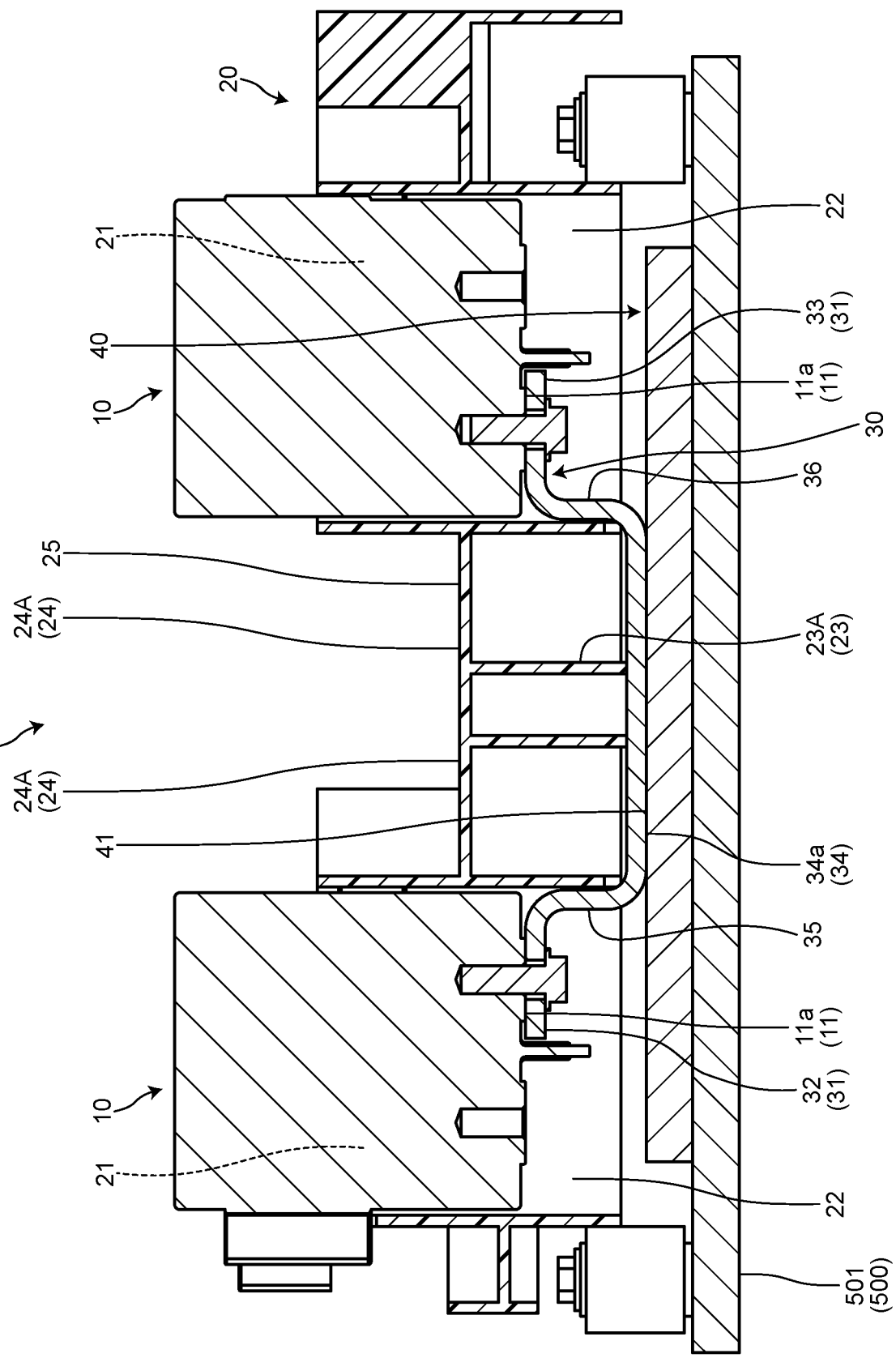
FIG. 3 is an explanatory diagram corresponding to a section along the line X-X in FIG. 2.

The reference sign 1 in FIGS. 1 to 4 indicates the electronic component unit of this embodiment. This electronic component unit 1 includes electronic components 10, an insulating holding member 20 holding the electronic components 10, and a conductive routing member 30 provided with electrical connection portions 31 physically and electrically connected to conductive members 11 of the electronic components 10 (FIGS. 1 to 4). This electronic component unit 1 is mounted in a vehicle, such as an electric vehicle with a rotary machine as a driving source, and electrically connects the electronic components 10 and the routing member 30 to an electrode of a battery pack (not illustrated) of this vehicle. Thus, this electronic component unit 1 includes a pressing structure pressing the routing member 30 against a cooling member 40 for cooling to restrain temperature rise of the electronic components and the routing member 30 caused by an increase in the capacity of the battery pack (FIG. 3).

Here, the cooling member 40 may be an object molded using a metal material having high thermal conductivity (for example, a metal plate molded from aluminum or the like as a raw material) or a flexible object containing cooling gel (so-called cooling sheet). This cooling member may be provided as a constituent of the electronic component unit 1, or not as a constituent of the electronic component unit 1 but as a component, in the vehicle, relating to this electronic component unit 1.

This cooling member 40 is fixed to a vehicle body side to prevent relative displacement between the cooling member and the vehicle body. For example, this cooling member is fixed to the battery pack of the vehicle and fixed indirectly to the vehicle body via this battery pack to prevent relative displacement, which is not illustrated.

To maintain the cooling performance of this cooling member 40, it is desirable to restrain temperature rise of this cooling member 40 by transferring heat of the cooling member 40 to another cooling member. For example, the battery pack of the vehicle is provided with a water-cooling cooler 500 for restraining the temperature rise (FIG. 3). Thus, here, cooling water of the cooler 500 of the battery pack may be used to restrain the temperature rise of the cooling member 40.

The cooling member 40 described herein is fixed to a metallic plate member 501 of the cooler 500 with a screw or the like while coming into surface contact with the plate member 501, to prevent relative displacement (FIG. 3). For example, the plate member 501 is molded using a metal material having high thermal conductivity (such as aluminum) and includes a cooling water passage formed for circulating the cooling water with a water pump (not illustrated) or the like. Thus, here, by transferring heat received by the cooling member 40 from the routing member from the plate member 501 to the cooling water in the cooling water passage, the temperature rise of the cooling member 40 can be restrained.

Note that the cooling member 40 may be a coolant coating applied in a recess provided in the plate member 501 or in an enclosure using a vertical wall provided on the plate member 501.

Figure 4:
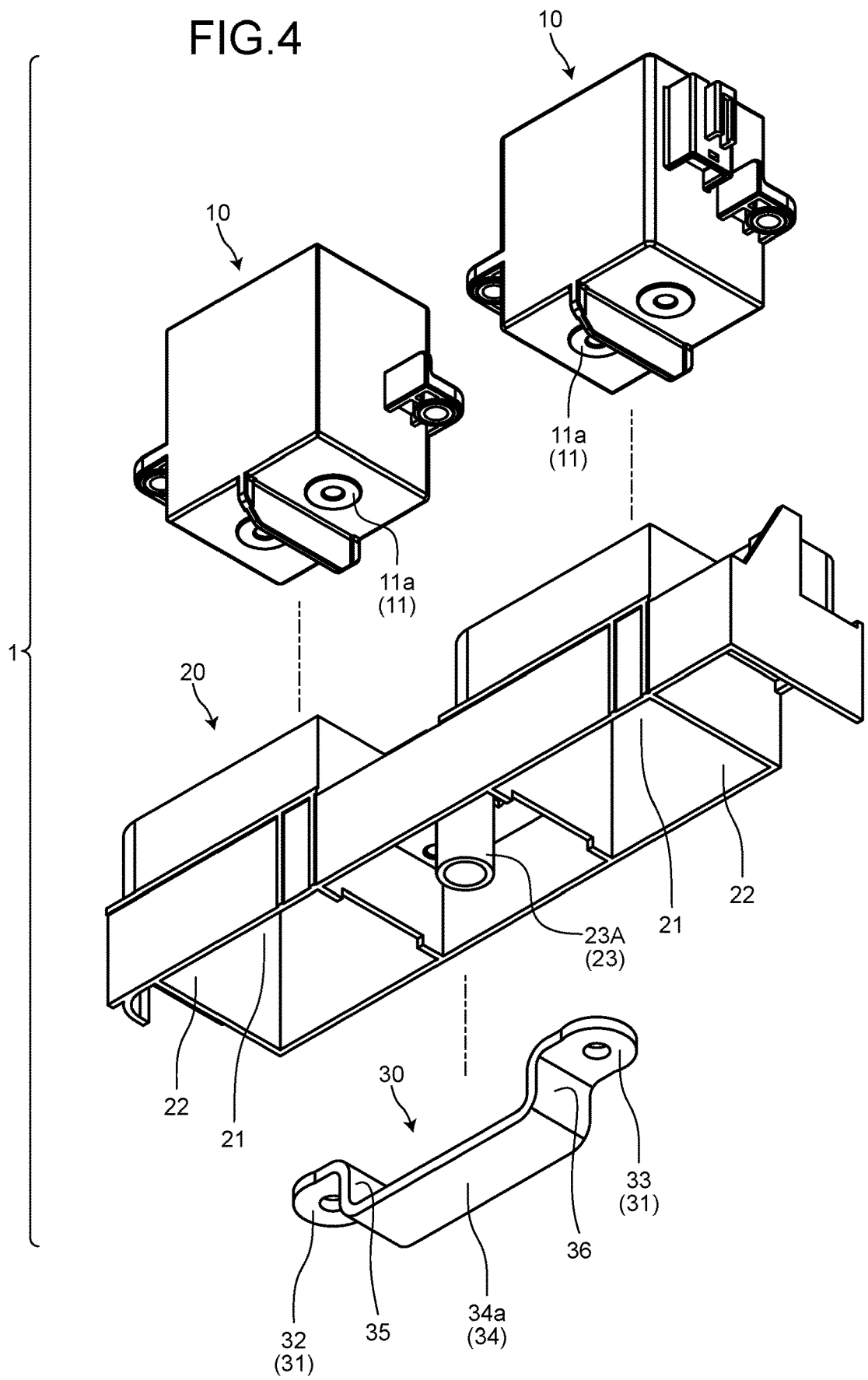
FIG. 4 is an exploded perspective view illustrating the electronic component unit of the embodiment.

Each of the electronic components 10 includes the conductive member 11 as one component composing its circuit, and an electrical connection portion 11a of this conductive member 11 is disposed, exposed to the outside (FIGS. 3 and 4). To the electrical connection portion 11a, the electrical connection portion 31 of the routing member 30 is connected physically and electrically. Examples of this electronic component 10 include a relay, a circuit protecting component (such as a fuse or a fusible link), and the like.

The electronic component unit 1 includes at least one electronic component 10. The electronic component unit 1 described herein includes two electronic components 10 being relays (FIGS. 1 to 4).

The holding member 20 is molded from an insulating material, such as synthetic resin. For example, this holding member 20 may hold the electronic components 10 by assembling the electronic components 10 with a mutual lock mechanism or may hold the electronic components 10 by fixing the electronic components 10 with screw members.

In this holding member 20, electronic component accommodating chambers 21 accommodating the electronic components 10 are formed (FIGS. 2 to 4). In this holding member 20, to physically and electrically connect the electrical connection portions 31 of the routing member 30 to the electrical connection portions 11a of the electronic components 10 fixed with screws in the electronic component accommodating chambers 21, the electronic components 10 are accommodated in the electronic component accommodating chambers 21 with the electrical connection portions 11a exposed. The holding member 20 described herein is provided with electrical connection chambers 22 that are chambers communicating with the electronic component accommodating chambers 21 and in which the electrical connection portions 31 of the routing member 30 are physically and electrically connected to the electrical connection portions 11a exposed in these chambers (FIGS. 1, 3, and 4).

The electronic component unit 1 includes at least one holding member 20. The electronic component unit 1 described herein includes one holding member 20. To this holding member 20, the two electronic components 10 are assembled at an interval therebetween. The holding member 20 described herein is provided with the electronic component accommodating chamber 21 and the electrical connection chamber 22 for each electronic component 10. In this holding member 20, insertion ports of the electronic component accommodating chambers 21 for the electronic components 10 open in the same direction, and insertion ports of the electrical connection chambers 22 for the electrical connection portions 31 open in a direction opposite to that of the insertion ports for the electronic components 10.

This holding member 20 is fixed to the vehicle body side to prevent relative displacement between the holding member 20 and the vehicle body. For example, this holding member 20 is fixed to the battery pack of the vehicle on the electrical connection chamber 22 side and fixed indirectly to the vehicle body via this battery pack to prevent relative displacement, which is not illustrated. Similar to the cooling member 40, the holding member 20 described herein is fixed to the plate member 501 of the cooler 500 with a screw or the like to prevent relative displacement (FIG. 3). Thus, here, no relative displacement occurs between the holding member 20 and the cooling member 40.

The routing member 30 is molded from a metal material, such as copper or copper alloy. This routing member 30 includes a first held portion 32 and a second held portion 33 held directly or indirectly by the holding member 20, a heat transferring portion 34 capable of transferring heat to the cooling member 40 in contact, a first spring portion 35 coupling the first held portion 32 to the heat transferring portion 34 and pressing the heat transferring portion 34 against the cooling member 40 with spring force generated between the first held portion 32 and the heat transferring portion 34, and a second spring portion 36 coupling the second held portion 33 to the heat transferring portion 34 and pressing the heat transferring portion 34 against the cooling member 40 with spring force generated between the second held portion 33 and the heat transferring portion 34 (FIGS. 1, 3, and 4).

The first held portion 32 and the second held portion 33 each may be fixed to the holding member 20 with a screw or the like to be held directly by the holding member 20 or may be fixed to another component, such as the electronic component 10, with a screw or the like to be held indirectly by the holding member 20 via the other component.

The routing member 30 described herein is physically and electrically connected to the respective electrical connection portions 11a of the two electronic components 10 and includes the electrical connection portion 31 for each electrical connection portion 11a (FIGS. 1, 3, and 4). Thus, by physically and electrically connecting one of the electrical connection portions 31 to the electrical connection portion 11a of one of the electronic components 10, the routing member 30 described herein is held directly by this electronic component 10. Furthermore, by physically and electrically connecting the other electrical connection portion 31 to the electrical connection portion 11a of the other electronic component 10, the routing member 30 described herein is held directly by this electronic component 10. In other words, the routing member 30 described herein is held indirectly by the holding member 20 via the one electronic component 10 using the one electrical connection portions 11a and 31 and is held indirectly by the holding member 20 via the other electronic component 10 using the other electrical connection portions 11a and 31. Thus, in the routing member 30 described herein, the one electrical connection portion 31 also functions as the first held portion 32, and the other electrical connection portion 31 also functions as the second held portion 33 (FIGS. 1, 3, and 4). In this routing member 30, for example, the one electrical connection portion 31 (first held portion 32) is fixed to the electrical connection portion 11a of the one electronic component 10 with a screw, and the other electrical connection portion 31 (second held portion 33) is fixed to the electrical connection portion 11a of the other electronic component 10 with a screw.

The heat transferring portion 34 includes a contact portion 34a coming into contact with a heat receiving portion 41 of the cooling member 40 and transferring heat to the heat receiving portion 41 when the temperature is higher than this heat receiving portion 41 (FIG. 3). This contact portion 34a desirably comes into contact with the heat receiving portion 41 over a large area to enhance the efficiency of transferring heat to the cooling member 40. Herein, the contact portion 34a is formed into a flat surface shape and comes into surface contact with the heat receiving portion 41 preliminarily formed into a flat surface shape or having a flat surface by pressing the contact portion 34a. For example, here, in a case where the cooling member 40 is a metal plate as exemplified above, the metal plate is molded into a flat plate shape to preliminarily form the heat receiving portion 41 into a flat surface shape. Alternatively, here, in a case where the cooling member 40 is a cooling sheet as exemplified above, pressing of the contact portion 34a deforms the heat receiving portion 41 to a flat surface in conformance to the flat surface shape of this contact portion 34a.

The first spring portion 35 can generate spring force from the first held portion 32 side toward the heat transferring portion 34 side or from the heat transferring portion 34 side toward the first held portion 32 side by contracting between the first held portion 32 and the heat transferring portion 34. Furthermore, the second spring portion 36 can generate spring force from the second held portion 33 side toward the heat transferring portion 34 side or from the heat transferring portion 34 side toward the second held portion 33 side by contracting between the second held portion 33 and the heat transferring portion 34.

As described above, the holding member 20 and the cooling member 40 are fixed to the plate member 501 of the cooler 500. Thus, the first held portion 32 and the second held portion 33 of the routing member 30 are fixed indirectly to the plate member 501 via the holding member 20 to prevent relative displacement and also fixed indirectly to the cooling member 40 to prevent relative displacement. When the holding member 20 is fixed to the plate member 501, the routing member 30 allows the contact portion 34a of the heat transferring portion 34 to come into contact with the heat receiving portion 41 of the cooling member 40 in the contracting states of the first spring portion 35 and the second spring portion 36. By this, in this routing member 30, the spring force from the first held portion 32 side toward the heat transferring portion 34 side in the first spring portion 35 and the spring force from the second held portion 33 side toward the heat transferring portion 34 side in the second spring portion 36 can press the contact portion 34a of the heat transferring portion 34 against the heat receiving portion 41 of the cooling member 40. That is, the pressing structure described herein is configured by the first held portion 32, the second held portion 33, the heat transferring portion 34, the first spring portion 35, and the second spring portion 36.

Even if a large current or the like produces heat in the electronic components 10 and the routing member 30, the electronic component unit 1 of this embodiment can release the heat from the heat transferring portion 34 of the routing member 30 to the cooling member 40. In this electronic component unit 1, to enhance the efficiency of transferring the heat from the heat transferring portion 34 to the cooling member 40, the spring force of the first spring portion 35 and the second spring portion 36 of the routing member 30 is used to press the heat transferring portion 34 against the cooling member 40 to prevent the heat transferring portion 34 from separating from the cooling member 40. In this way, the electronic component unit 1 of this embodiment can constantly press the heat transferring portion 34 against the cooling member 40 and can thus restrain excessive temperature rise of the electronic components 10 and the routing member 30. In particular, the electronic component unit 1 described herein can bring the heat transferring portion 34 into surface contact with the cooling member 40 while constantly pressing the heat transferring portion 34 against the cooling member 40 and can thus further restrain excessive temperature rise of the electronic components 10 and the routing member 30.

Furthermore, this electronic component unit 1 uses the spring force possessed by the routing member 30 itself to press the heat transferring portion 34 against the cooling member 40, so that an elastic member, such as a helical spring, is not required to be provided additionally, resulting in restraint in a cost increase and reduction in size due to restraint in an increase in the number of components.

Furthermore, in this electronic component unit 1, the first held portion 32 and the second held portion 33 of the routing member 30 are held directly or indirectly by the holding member 20. Thus, in this electronic component unit 1, position shift of the heat transferring portion 34 of the routing member 30 relative to the heat receiving portion 41 of the cooling member 40 due to vibration from the vehicle traveling or the like does not occur, so that the performance of cooling the routing member 30 by the cooling member 40 can be maintained.

Furthermore, in this electronic component unit 1, force received by the heat transferring portion 34 from the cooling member 40 can be absorbed by the first spring portion 35 and the second spring portion 36. Thus, this electronic component unit 1 can reduce a load imposed from the one electrical connection portion 31 (first held portion 32) on the electrical connection portion 11a of the one electronic component 10 and a load imposed from the other electrical connection portion 31 (second held portion 33) on the electrical connection portion 11a of the other electronic component 10. Thus, this electronic component unit 1 can restrain a decrease in the durability of each electronic component 10.

In specific, the following forms of the routing member 30 can be applied to this electronic component unit 1.

FIG. 5 illustrates a routing member 30A configured as an elastically deformable laminate in which a plurality of conductive thin films are laminated, as an example routing member 30. For example, this routing member 30A is formed as a laminate in which a plurality of pieces of metal foil, such as copper foil, are laminated.

In this routing member 30A, to maintain the laminated state of the thin films, it is desirable to join together the overlapped thin films in at least portions corresponding to the one electrical connection portion 31 (first held portion 32) and the other electrical connection portion 31 (second held portion 33). Furthermore, in this routing member 30A, to enhance the efficiency of transferring heat from the heat transferring portion 34 to the cooling member 40, it is desirable to join together the overlapped thin films in at least a portion corresponding to the heat transferring portion 34. Possible methods of joining the thin films are, for example, to join the thin films using conductive adhesive, to join the thin films by ultrasound, and the like.

Here, in this routing member 30A, as long as the portions where the thin films are joined together have elastically deformable flexibility and spring force can be generated between the one electrical connection portion 31 (first held portion 32) and the heat transferring portion 34 and between the other electrical connection portion 31 (second held portion 33) and the heat transferring portion 34, the overlapped thin films may be joined together in portions corresponding to the first spring portion 35 and the second spring portion 36.

FIG. 6 illustrates a routing member 30B in which at least the first spring portion 35 and the second spring portion 36 are configured as elastically deformable laminates in which a plurality of conductive thin films are laminated, as an example routing member 30. Similar to the above-described routing member 30A, in this routing member the portions formed as the laminates also have a plurality of pieces of metal foil, such as copper foil, laminated. Similar to the above-described routing member 30A, in this routing member 30B, the thin films may also be joined together in necessary portions in the portions formed as the laminates.

For example, in this routing member 30B, the first spring portion 35 and the second spring portion 36 are formed as the laminates of the thin films, and the one electrical connection portion 31 (first held portion 32), the other electrical connection portion 31 (second held portion 33), and the heat transferring portion 34 are molded as single-layered objects made from a conductive plate material. This routing member 30B is provided, between the first spring portion 35 and the one electrical connection portion 31 (first held portion 32), between the first spring portion 35 and the heat transferring portion 34, between the second spring portion 36 and the other electrical connection portion 31 (second held portion 33), and between the second spring portion 36 and the heat transferring portion 34, with connection structures physically and electrically connecting the first spring portion 35 to the one electrical connection portion 31 (first held portion 32), the first spring portion 35 to the heat transferring portion 34, the second spring portion 36 to the other electrical connection portion 31 (second held portion 33), and the second spring portion 36 to the heat transferring portion 34. Possible examples of these connection structures are a structure joining ends of the constituents with conductive adhesive or by ultrasound, and the like.

For example, in this routing member 30B, the one electrical connection portion 31 (first held portion 32), the other electrical connection portion 31 (second held portion 33), the first spring portion 35, and the second spring portion 36 are formed as the laminates of the thin films, and the heat transferring portion 34 is molded as a single-layered object made from a conductive plate material. FIG. 6 illustrates this example. This routing member 30B is provided, between the first spring portion 35 and the heat transferring portion 34 and between the second spring portion 36 and the heat transferring portion 34, with the above-described connection structures physically and electrically connecting the first spring portion 35 to the heat transferring portion 34 and the second spring portion 36 to the heat transferring portion 34.

FIG. 7 illustrates a routing member 30C molded overall as a single-layered object made from a conductive plate material, as an example routing member 30. For example, this routing member 30C is a so-called bus bar press-molded from a metal plate as a base material. In this routing member 30C, for example, the first spring portion 35 and the second spring portion 36 include elastically deforming portions 35a and 36a each bent into an arc shape so as to have spring properties. The first spring portion 35 and the second spring portion 36 described here include the elastically deforming portions 35a and 36a each bent into an S shape. Thus, the first spring portion 35 can contract between the one electrical connection portion 31 (first held portion 32) and the heat transferring portion 34. Furthermore, the second spring portion 36 can contract between the other electrical connection portion 31 (second held portion 33) and the heat transferring portion 34.

Now, the description has been provided in which the spring force possessed by the routing member 30 is used to press the heat transferring portion 34 of this routing member 30 against the cooling member 40. Unfortunately, for example, in the routing member 30, the spring constants of the first spring portion 35 and the second spring portion 36 do not always exactly coincide with each other, and the length between the one electrical connection portion 31 (first held portion 32) and the heat transferring portion 34 in the first spring portion 35 does not always exactly coincide with the length between the other electrical connection portion 31 (second held portion 33) and the heat transferring portion 34 in the second spring portion 36. In this case, it is conceivable that, in the routing member 30, the contact portion 34a of the heat transferring portion 34 is not in surface contact with the heat receiving portion 41 of the cooling member 40. Furthermore, for example, in the routing member 30A, the heat transferring portion 34 has flexibility, so that it is conceivable that deformation of this heat transferring portion 34 or the like prevents the contact portion 34a of this heat transferring portion 34 from coming into surface contact with the heat receiving portion 41 of the cooling member 40.

Thus, the pressing structure described herein includes a pressure portion 23 provided as part of the holding member 20 and pressing the heat transferring portion 34 against the cooling member 40 by exerting pressing force on the heat transferring portion 34 sandwiched between the pressure portion 23 and the cooling member 40 (FIGS. 1 to 4). This pressing structure includes at least one pressure portion 23. With this, this electronic component unit 1 can press the heat transferring portion 34 of the routing member 30 against the cooling member 40 to enable surface contact between these and can thus appropriately restrain excessive temperature rise of the electronic components 10 and the routing member 30.

For example, if the heat transferring portion 34 is a rigid single-layered object, the pressure portion 23 may have such a size that exerting of the pressing force on part of the heat transferring portion 34 presses this heat transferring portion 34 against the cooling member 40 or may have such a size that exerting of the pressing force on the entire heat transferring portion 34 presses this heat transferring portion 34 against the cooling member 40. This pressure portion 23, of whatever size, can bring the heat transferring portion 34 into surface contact with the cooling member 40 over a wide area.

On the other hand, if the heat transferring portion 34 is a flexible laminate, the wider the area where the pressing force is exerted on the heat transferring portion 34, the wider the area where this pressure portion 23 can bring the heat transferring portion 34 into surface contact with the cooling member 40. Thus, the pressure portion 23 in this case desirably has such a size that exerting of the pressing force on the entire heat transferring portion 34 presses this heat transferring portion 34 against the cooling member 40.

This pressure portion 23 may be pressed against an area capable of being in contact of the heat transferring portion 34 having the area capable of being in contact expanded by increasing in its size. If the heat transferring portion 34 has an expanded area capable of being in contact, the number of the pressure portions 23 may be increased for the expansion, and the pressure portions 23 may be pressed against the area capable of being in contact of the heat transferring portion 34 in a distributed manner.

Furthermore, the pressing structure described herein includes elastically deforming portions 24 provided as part of the holding member 20 and pressing the pressure portion 23 against the heat transferring portion 34 with force reacting to elastic deformation (FIGS. 2 and 3). This enables the electronic component unit 1 to restrain an overload on the heat transferring portion 34 from the pressure portion 23, resulting in restraint of a decrease in the durability of the routing member 30 and the cooling member 40.

In specific, the following forms of the pressure portion 23 and the elastically deforming portions 24 can be applied to this electronic component unit 1.

FIGS. 1 to 4 illustrate one pressure portion 23A shaped into a round tube and protruding from a wall 25 of the holding member 20 toward the heat transferring portion 34, as an example pressure portion 23. Furthermore, FIGS. 2 and 3 illustrate a plurality of elastically deforming portions 24A coupled to this pressure portion 23A, as example elastically deforming portions 24 relating to this pressure portion 23A.

This pressure portion 23A protrudes from the wall 25 in a tube axis direction, and its ring surface at one end in the tube axis direction comes into contact with the heat transferring portion 34. This pressure portion 23A alone handles a loaded area for exerting pressing force on the heat transferring portion 34 and includes the ring surface, at the one end, having such a size that the loaded area is covered. The wall 25 includes a concentric ring-shaped hole portion 25a at a peripheral edge at the other end in the tube axis direction of this pressure portion 23A and a plurality of elastically deformable shaft portions coupling an outer peripheral edge portion to an inner peripheral edge portion of this hole portion 25a (FIG. 2). Herein, four elastically deformable shaft portions are formed at regular intervals around the axis of the tube of the pressure portion 23A, and each of these shaft portions is used as the elastically deforming portion 24A. Note that this pressure portion 23A may be formed into a column shape, such as a round column shape, instead of the round tube shape.

FIG. 8 illustrates one pressure portion 23B shaped into a square tube and protruding from the wall 25 of the holding member 20 toward the heat transferring portion 34, as an example pressure portion 23. Furthermore, FIG. 8 illustrates a plurality of elastically deforming portions 24B coupled to this pressure portion 23B, as example elastically deforming portions 24 relating to this pressure portion 23B.

These pressure portion 23B and elastically deforming portions 24B correspond to substitutes for the above-described pressure portion 23A and elastically deforming portions 24A. Thus, this pressure portion 23B protrudes from the wall 25 in a tube axis direction, and its square ring surface at one end in the tube axis direction comes into contact with the heat transferring portion 34. Similar to the above-described pressure portion 23A, this pressure portion 23B alone handles the loaded area for exerting pressing force on the heat transferring portion 34 and includes the square ring surface, at the one end, having such a size that the loaded area is covered. The wall 25 includes a square-ring-shaped hole portion 25b having a similar shape at a peripheral edge at the other end in the tube axis direction of this pressure portion 23B and a plurality of elastically deformable shaft portions coupling an outer peripheral edge portion to an inner peripheral edge portion of this hole portion 25b. Herein, four elastically deformable shaft portions are formed at regular intervals around the axis of the tube of the pressure portion 23B, and each of these shaft portions is used as the elastically deforming portion 24B. Note that this pressure portion 23B may be formed into a column shape, such as a square column shape, instead of the square tube shape.

FIG. 9 illustrates a plurality of (herein, two) pressure portions 23C shaped into a square column and protruding from the wall 25 of the holding member 20 toward the heat transferring portion 34, as example pressure portions 23. Furthermore, FIG. 9 illustrates a plurality of elastically deforming portions 24C coupled to the pressure portions 23C for the respective pressure portions 23C, as example elastically deforming portions 24 relating to these pressure portions 23C.

These pressure portions 23C protrude from the wall 25 in an axis direction, and their quadrilateral surfaces at ends on one side in the axis direction come into contact with the heat transferring portion 34. Unlike the above-described pressure portions 23A and 23B, these pressure portions 23C handle the loaded area for exerting pressing force on the heat transferring portion 34 as a plurality of portions and each include, for one of a plurality of positions in the loaded area, the quadrilateral surface, at the end on the one side, having such a size that the corresponding position is covered. The wall 25 includes square-ring-shaped hole portions 25c, similar to the hole portion 25b for the pressure portion 23B, at a peripheral edge at the other ends in the axis direction of these pressure portions 23C and a plurality of elastically deformable shaft portions coupling outer peripheral edge portions to inner peripheral edge portions of these hole portions 25c. Herein, four elastically deformable shaft portions are formed at regular intervals around the axis of each pressure portion 23C, and each of these shaft portions is used as the elastically deforming portion 24C. Note that these pressure portions 23B may be formed into a tube shape, such as a round tube shape or a square tube shape, instead of the square column shape.

Now, this electronic component unit 1 may include a plurality of the holding members 20, and the routing member to be cooled by the cooling member 40 may be disposed across a plurality of the holding members 20. In this case, any one of the holding members 20 is provided with the pressing structure so that the pressing structure is not distributed between the holding members 20. By this, in this electronic component unit 1, the first held portion 32 and the second held portion 33 are not disposed across the holding members 20, and the routing member 30 is less affected by assembly tolerance of the holding members 20, so that imbalance in the force of pressing the heat transferring portion 34 against the cooling member 40 in the routing member 30 can be restrained. Furthermore, in this electronic component unit 1, the combination of the pressure portion 23 and the elastically deforming portions 24 is not disposed across the holding members 20 and is less affected by the assembly tolerance of the holding members 20, so that imbalance in pressing force exerting on the heat transferring portion 34 from the pressure portion 23 can be restrained. Thus, with these effects of restraining imbalance in various types of force, this electronic component unit 1 can bring the heat transferring portion 34 into surface contact with the cooling member 40 while constantly pressing the heat transferring portion 34 against the cooling member 40 and can thus restrain excessive temperature rise of the electronic components 10 and the routing member 30.

Even if a large current or the like produces heat in the electronic component and the routing member, the electronic component unit according to the present embodiment can release the heat from a heat transferring portion of the routing member to a cooling member. In this electronic component unit, to enhance the efficiency of transferring the heat from the heat transferring portion to the cooling member, the spring force of a first spring portion and a second spring portion of the routing member is used to press the heat transferring portion against the cooling member to prevent the heat transferring portion from separating from the cooling member. In this way, the electronic component unit according to the present embodiment can constantly press the heat transferring portion against the cooling member and can thus restrain excessive temperature rise of the electronic component and the routing member.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit comprising:
an electronic component;
a holding member having an insulating property and holding the electronic component;
a routing member having conductivity and provided with an electrical connection portion physically and electrically connected to a conductive member of the electronic component; and
a pressing structure pressing the routing member against a cooling member for cooling, wherein
the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and
the pressing structure being configured by the first held portion, the second held portion, the heat transferring portion, the first spring portion, and the second spring portion, and
wherein the pressing structure includes a pressure portion provided as part of the holding member and pressing the heat transferring portion against the cooling member by exerting pressing force on the heat transferring portion sandwiched between the pressure portion and the cooling member, wherein the pressing structure includes an elastically deforming portion provided as part of the holding member and pressing the pressure portion against the heat transferring portion with force reacting to elastic deformation.

2. The electronic component unit according to claim 1, wherein the routing member is a laminate deformable elastically, a plurality of conductive thin films being laminated in the laminate.

3. The electronic component unit according to claim 2, wherein, in a case where the routing member to be cooled is disposed across a plurality of the holding members, any one of the holding members is provided with the pressing structure.

4. The electronic component unit according to claim 1, wherein at least the first spring portion and the second spring portion in the routing member are formed as laminates deformable elastically, a plurality of conductive thin films being laminated in each of the laminates.

5. The electronic component unit according to claim 4, wherein, in a case where the routing member to be cooled is disposed across a plurality of the holding members, any one of the holding members is provided with the pressing structure.

6. The electronic component unit according to claim 4, wherein the heat transferring portion is molded as a single-layered object made from a conductive plate material.

7. The electronic component unit according to claim 6, wherein, in a case where the routing member to be cooled is disposed across a plurality of the holding members, any one of the holding members is provided with the pressing structure.

8. The electronic component unit according to claim 1, wherein, in a case where the routing member to be cooled is disposed across a plurality of the holding members, any one of the holding members is provided with the pressing structure.

9. An electronic component unit comprising:
an electronic component;
a holding member having an insulating property and holding the electronic component;
a routing member having conductivity and provided with an electrical connection portion physically and electrically connected to a conductive member of the electronic component; and
a pressing structure pressing the routing member against a cooling member for cooling, wherein
the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and the pressing structure being configured by the first held portion, the second held portion, the heat transferring portion, the first spring portion, and the second spring portion, and wherein the routing member is a laminate deformable elastically, a plurality of conductive thin films being laminated in the laminate.

10. The electronic component unit according to claim 9, wherein the pressing structure includes a pressure portion provided as part of the holding member and pressing the heat transferring portion against the cooling member by exerting pressing force on the heat transferring portion sandwiched between the pressure portion and the cooling member.

11. The electronic component unit according to claim 10, wherein, in a case where the routing member to be cooled is disposed across a plurality of the holding members, any one of the holding members is provided with the pressing structure.

12. The electronic component unit according to claim 9, wherein, in a case where the routing member to be cooled is disposed across a plurality of the holding members, any one of the holding members is provided with the pressing structure.

13. An electronic component unit comprising:
an electronic component;
a holding member having an insulating property and holding the electronic component;
a routing member having conductivity and provided with an electrical connection portion physically and electrically connected to a conductive member) of the electronic component; and
a pressing structure pressing the routing member against a cooling member for cooling, wherein
the routing member including a first held portion and a second held portion held directly or indirectly by the holding member, a heat transferring portion capable of transferring heat to the cooling member in contact, a first spring portion coupling the first held portion to the heat transferring portion and pressing the heat transferring portion against the cooling member with spring force generated between the first held portion and the heat transferring portion, and a second spring portion coupling the second held portion to the heat transferring portion and pressing the heat transferring portion against the cooling member with spring force generated between the second held portion and the heat transferring portion, and
the pressing structure being configured by the first held portion, the second held portion, the heat transferring portion, the first spring portion, and the second spring portion, and
wherein at least the first spring portion and the second spring portion in the routing member are formed as laminates deformable elastically, a plurality of conductive thin films being laminated in each of the laminates.

14. The electronic component unit according to claim 13, wherein the pressing structure includes a pressure portion provided as part of the holding member and pressing the heat transferring portion against the cooling member by exerting pressing force on the heat transferring portion sandwiched between the pressure portion and the cooling member.

15. The electronic component unit according to claim 14, wherein, in a case where the routing member to be cooled is disposed across a plurality of the holding members, any one of the holding members is provided with the pressing structure.

16. The electronic component unit according to claim 13, wherein the heat transferring portion is molded as a single-layered object made from a conductive plate material.

17. The electronic component unit according to claim 16, wherein, in a case where the routing member to be cooled is disposed across a plurality of the holding members, any one of the holding members is provided with the pressing structure.

18. The electronic component unit according to claim 13, wherein the pressing structure includes a pressure portion provided as part of the holding member and pressing the heat transferring portion against the cooling member by exerting pressing force on the heat transferring portion sandwiched between the pressure portion and the cooling member, and
   wherein the heat transferring portion is molded as a single-layered object made from a conductive plate material.

19. The electronic component unit according to claim 18, wherein, in a case where the routing member to be cooled is disposed across a plurality of the holding members, any one of the holding members is provided with the pressing structure.

20. The electronic component unit according to claim 13, wherein, in a case where the routing member to be cooled is disposed across a plurality of the holding members, any one of the holding members is provided with the pressing structure.

* * * * *